(12) United States Patent
Collins et al.

(10) Patent No.: US 7,408,967 B2
(45) Date of Patent: Aug. 5, 2008

(54) METHOD OF FABRICATING SINGLE MODE VCSEL FOR OPTICAL MOUSE

(75) Inventors: Douglas Collins, Albuquerque, NM (US); Neinyi Li, Albuquerque, NM (US)

(73) Assignee: Emcore Corporation, Albuquerque, NM (US)

( * ) Notice: Subject to any disclaimer, the term of this patent is extended or adjusted under 35 U.S.C. 154(b) by 0 days.

(21) Appl. No.: 11/441,372

(22) Filed: May 25, 2006

(65) Prior Publication Data

US 2007/0153861 A1  Jul. 5, 2007

(51) Int. Cl.
*H01S 5/00* (2006.01)
(52) U.S. Cl. .................. 372/46.01; 372/45.01
(58) Field of Classification Search ............ 372/50.124, 372/50.11, 46.01, 45.01; 438/22; 257/84
See application file for complete search history.

(56) References Cited

U.S. PATENT DOCUMENTS 6,185,241 B1 *  2/2001  Sun .......................... 372/46.01

6,751,245 B1 *  6/2004  Wasserbauer et al. .... 372/46.01
2004/0233963 A1 * 11/2004  Hooper et al. ................ 372/99
2004/0264531 A1 * 12/2004  Ryou et al. ................... 372/45

FOREIGN PATENT DOCUMENTS

GB       WO 00/45483      *  1/2000

* cited by examiner

*Primary Examiner*—Minsun Harvey
*Assistant Examiner*—Tuan N. Nguyen

(57) ABSTRACT

A surface emitting laser having a substrate with top and bottom surfaces, a first stack of mirror layers of alternating indices of refraction located upon the top surface of the substrate and an active layer disposed over the first stack. The surface emitting layer also includes a second stack of mirror layers of alternating indices of refraction disposed over the active layer and a reduced-diameter mirror extension portion of the second stack that forms an optical aperture of the surface emitting laser extending outwards from a center portion of the second stack on a side of the second stack opposite the active layer.

20 Claims, 10 Drawing Sheets

METHOD OF FABRICATING SINGLE MODE VCSEL FOR OPTICAL MOUSE

BACKGROUND OF THE INVENTION

1. Field of the Invention

The present invention relates to vertical cavity surface emitting lasers (VCSELs), and more particularly to VCSELs with mode control formed by selective patterning of upper mesa structures.

2. The Background Art

A typical VCSEL configuration includes an active region between two mirrors disposed one over another on the surface of the substrate wafer. An insulating region between the mirrors forces the current to flow through a small aperture, and the device lases perpendicular to the wafer surface (i.e., the "vertical" part of VCSEL). One type of VCSEL in particular, the proton VCSEL, wherein the insulating region is formed by a proton implantation, dominated the early commercial history of VCSELs. In the oxide-guided VCSEL, the insulating region is formed by partial oxidation of a thin, high aluminum-content layer within the structure of the mirror. This same oxidation process can be applied to other semiconductor structures, to produce both optoelectronic and purely electronic devices.

Vertical-cavity surface-emitting lasers (VCSELs) have become the laser technology of choice for transceivers used in Storage-Area Network (SAN) and Local Area Network (LAN) applications. There are two major technology platforms for manufacturing VCSELs. The difference in these platforms is based on the different techniques of current confinement, either by ion-implantation or confined by oxide layers. The two methods of forming a current confining structure in a VCSEL are ion implantation and selective oxidation. In the ion implantation technique, ions are implanted in a portion of the upper reflection layer so as to form a high resistance region, thereby confining the current flow to a defined region. In the selective oxidation technique, the peripheral region of a mesa structure is oxidized, thereby defining an aperture surrounded by a high resistance region.

More particularly, in the selective oxidation method, after depositing an AlGaAs layer on a lower portion of an upper reflector, which is to be a high-resistance region, the resultant structure is etched, resulting in individual VCSELs on a wafer. Next, the wafer is left in an oxidation atmosphere for a predetermined period of time, to allow diffusion of vapor into the peripheral portion of the AlAs layer. As a result, an oxide insulating layer is formed at the peripheral portion as the high-resistance region, which limits flow of current, thereby resulting in an aperture surrounded by the high-resistance region.

The oxidative diffusion rate in forming an aperture of a VCSEL is highly sensitive to the temperature of a furnace for use in the oxidative diffusion, oxidation time and the amount of oxygen supplied into the furnace. A variation in the diffusion rate is a serious problem in mass production that requires high repeatability, and in forming a particular size of the aperture.

The implanted VCSELs have been proven very reliable. However, the operating speed of the implanted VCSELs is usually limited for applications requiring less than 2 Gb/sec operating speed. Oxide VCSELs provide many superior properties of VCSEL performance including higher speed (demonstrated greater than 23 Gb/sec) and higher efficiency. However, the time in the field for SAN and LAN applications with oxide VCSELs has not been as long as the implanted VCSELs.

The electromagnetic wave propagation design of current commercially available 10 Gb/s VCSEL is single mode in the longitudinal or growth direction (z-axis) and multi-mode in the transverse or perpendicular to the growth direction (r-plane). Along the z-axis, the active semiconductor layer thicknesses are designed so that only a single optical mode couples to the laser gain peak. In the r-plane, the allowed transverse modes are determined by the size of the oxide aperture. Another mode determining characteristic is that looking outward radially from the center of the mesa, there is a gradual drop in the average refractive index of the layer of approximately 5% due the oxide aperture. This change in refractive index leads to index guiding of the transverse modes.

In the selective oxidation type VCSEL, if the diameter of a light emitting region (nearly corresponding to the diameter of a non-selective oxidation region) is enlarged for the purpose of increasing an output power, the VCSEL produces oscillations of various orders, that is, produces a so-called multimode oscillation. In the multimode oscillation, a spectral line width is made wide and the optical fiber has mode dispersion characteristics, so the attenuation of signal in the fiber is increased, or a mode state is made unstable and thus the main order of mode of the oscillation is easily varied by a change in the amount of current injected and a change in the environmental temperature. A dynamic change in the mode order is not preferable because it changes a coupling efficiency with the fiber.

To avoid the problem of mode instability due to multiple transverse modes, there have been a number or approaches suggested in the prior art. U.S. Pat. No. 6,990,128 describes a number of these approaches of controlling a transverse mode oscillation, and we reiterate such description here. The first approach to ensure oscillation only in the fundamental mode of the lowest order (0 order) is by making the diameter of the light emitting region smaller. However, when the diameter of the light emitting region of the VCSEL is reduced typically, to 4 um or less, (which is smaller than that of the high above-described proton injection type VCSEL) these VCSELs have a high element resistance and are thus unable to produce high output power. Making the transverse mode stable is an important requirement for preventing the signal from being attenuated when the VCSEL is optically coupled to the optical fiber. In addition, it is necessary to improve electric optical characteristics.

Among ideas for simultaneously realizing opposing goals of making the transverse mode stable, and reducing resistance and increasing output power in the selective oxidation type VCSEL having excellent luminous efficiency and high response performance, is a VCSEL having a structure disclosed in IEEE Photonics Technology Letters, Vo. 11, No. 12, page 1536-1538 (see FIG. 13). In this example, the diameter of the light emitting region is as large as 20 um but the inside of an electrode aperture emitting laser light is etched away to a depth of 40 nm except for a region of a radius of 7.75 um from the center of the aperture. Since the diameter of the light emitting region is as large as 20 um, in the case where there is no surface processing, the order of oscillation mode is varied in accordance with the amount of injection current and thus a far-field image is observed to vary; in contrast, a surface emitting semiconductor laser with a hole produces a fundamental mode up to an optical output of 0.7 mW but when current exceeding that level is injected, the mode splits to gradually widen the far-field image.

The purpose of the VCSEL described above is to improve the optical output power in the fundamental mode. However, the maximum optical output power of the surface emitting semiconductor laser with a hole is 10.4 mW, whereas the output power in the fundamental mode is only 0.7 mW. Taking into account that the maximum output power in the case where there is no surface processing is 17.9 mW, the prior art configuration described above clearly shows that it is very difficult to make the transverse mode stable and to produce a large optical output power at the same time.

In this respect, various other VCSEL structures for controlling the mode have been proposed. For example, U.S. Pat. No. 5,940,422 discloses a VCSEL in which a mode control is performed by forming two regions of different film thicknesses. In the '422 patent, only a region on which an additional film is deposited becomes a light emitting region. It is thought that the purpose of the invention is to artificially determine the position of a light emitting spot and not to determine the position by taking into consideration the specific oscillation to be produced in the VCSEL (for example, the oscillation mode of producing five light emitting spots, described as one preferred embodiment, does not exist in the natural world).

Further, U.S. Pat. No. 5,963,576 discloses a VCSEL having an annular waveguide. In particular, the invention provides a mode in which light emitting spots are arranged regularly in an annular region so as to produce a "super resolution spot" and not necessarily to deliberately produce a specific oscillation mode of a determined order.

IEEE Photonics Technology Letters, Vol. 9, No. 9, page 1193-1195, discloses a VCSEL having a configuration in which a circular cavity is formed on the top surface of a post by etching to locally vary a mirror reflectivity. The paper reports that the spectral line width of this device is reduced to a half of that of a device with no cavity to produce an effect of suppressing the mode. However, as the amount of current injected increases, an oscillation spectrum is observed to vary. This clearly shows that a specific oscillation mode is not always dominant, in other words, that the mode is not stable.

Further, Electronics Letters, Vol. 34, No. 7, page 681-682, (April 1998) proposes a VCSEL having a configuration in which a circular cavity is formed on the top surface of a post by etching and in which an annular light emitting region is formed on the outer peripheral portion of the cavity. It is clear from a near-field pattern that a very high order (larger than $30^{th}$ order) mode is produced and at the same time that there are large variations in the intensity of light emitting spot. This shows that it is difficult to inject a uniform current into the annular region of an inside diameter as large as 30 um. Therefore, there is plenty of room for improvement of the VCSEL in order to obtain a stable high order mode oscillation for practical application.

As described above, as to the VCSEL expected as a light source for a multimode type optical fiber, the state of art in the VCSEL technology can not provide a device that satisfies a requirement of stabilizing a transverse mode and has high output power, low resistance, high efficiency and high speed response.

U.S. Pat. No. 6,990,128 discloses a method for fabricating a single mode VCSEL. However, the single mode it supports is a high order transverse mode instead of the fundamental mode.

U.S. Pat. No. 6,990,128 describes providing a resonator and discloses a structure with a first region in which a light emitting region is formed, an active layer, and a second reflection layer formed so as to sandwich the active layer between the first reflection layer and the second reflection layer, wherein the light emitting region includes a boundary region for suppressing the light emission of oscillation modes except for a specific oscillation mode; in particular a plurality of divided regions which are substantially divided by the boundary region to produce a light emitting spot corresponding to the specific oscillation mode.

The disadvantages of such a design are

1. Since all but a single mode is suppressed, the total power output of the device is low. FIG. 5 of U.S. Pat. No. 6,990,128 shows LI curves "with hole" and "without hole." The total output power is reduced by almost 50%, and it appears that the LI curve rolls over at a lower drive current when the mode selection is employed. Accordingly, low output power limits the length of any optical link which uses such design.

2. As detailed in the patent (e.g. FIGS. 3A, 3B, 7A, 7B, 8A, 8B . . . ) a complex and precise pattern must be used in fabrication of the laser in order to select a single high-order mode. Additionally, the patent does not discuss how the alignment of the pattern to the oxide aperture effects the device performance.

3. Since the device is intentionally single mode when used with single mode fiber, such a single mode laser has the advantage of the elimination of modal dispersion. However, if a multimode fiber or a multimode waveguide is used, single mode lasers generally suffer significant jitter penalties due to mode mixing while propagating in the fiber. When using single mode lasers in multimode fiber, it is critical to precisely control the laser launch condition which adds cost, and complexity to the system. A second fundamental issue with single mode lasers is back reflection from the coupling optics into the laser cavity. Since a single mode is present the back reflection destabilizes the laser adding jitter to the signal. The industry standard solutions to this problem are either inserting an optical isolator between the laser and the coupling optics (which adds cost and complexity to the system), or restricting the laser power to a level where interference in the cavity is not a problem (however, due to the power restrictions, this limits the applications where this device can be employed).

A more detailed analysis and description of the transverse modes in a VCSEL would be useful at this point. The transverse modes can be grouped into two classes: oxide aperture center modes (ACM) and oxide aperture edge modes (AEM). Due to optical scattering by the oxidized layer, the ACM's will always have lower intrinsic loss than the AEM's. As a result, the ACM's have lower threshold gains, and they will lase before the AEM's, and dominate laser emission near threshold. However, excepting the case of a transparent contact covering the laser emission aperture, the injected current will always have a radial component moving from the outside of the oxide aperture toward the aperture center. Because of this radial current injection, well above threshold the AEM modes will dominate the laser emission. Above threshold, the carrier lifetime drops dramatically due to stimulated emission. Consequently, the carrier diffusion length drops and they are no longer able to reach the center of the aperture.

The difficulty in achieving narrow spectral width is caused by tradeoffs inherent in choosing the size of the oxide aperture. Smaller apertures, reduce the number of allowed transverse modes, but have a number of problems related to device reliability: First, the device resistance is inversely proportional to the square of the aperture diameter. From this perspective the minimum aperture size is set by impedance matching to the driver. Second, the ESD damage threshold is also inversely proportional to the square of the aperture diameter. Lower ESD thresholds add cost and complexity to the manufacturing process and increase the risk of field failures. Third, the wear out reliability is proportional to the square of the current density. At constant current, the wear out lifetime is inversely proportional to the aperture diameter to the fourth power. Fourth, the thermal impedance is inversely proportional to aperture diameter. Smaller devices have higher junction temperatures and hence reduced wear out lifetimes. Fifth, smaller apertures require a higher fraction of oxidized AlGaAs, which increases the mechanical strain in the laser.

Another issue in prior art VCSELs is the sensitivity of the spectral width to drive current and ambient temperature. These effects are caused by both the competition between ACMs and AEMs, and the number of transverse modes that are present due to the size of the oxide aperture. As drive current increases, more of the higher loss AEMs reach threshold. Hence, the SW of the laser increases with drive current. At low temperature, the overall loss in the laser decreases, and more of the AEMs reach threshold. Hence, the SW also increases with decreasing temperature.

Still another issue is the problem of jitter and undershoot caused by mode competition in modulating a multimode VCSEL caused by the alternating dominance of the ACM and AEM modes as the laser is modulated. Compared to the AEM modes, the ACM modes respond slower to current modulation. First, the carriers have to diffuse farther to reach the aperture center. Second, the AEM modes have additional loss due to scattering by the oxide aperture. The net result is reduction in the optical lifetime which allows the optical modes to better track the drive current as the laser is modulated.

Prior to the present invention, there has not been a commercially practical oxidation type VCSEL with narrow spectral width suitable for use within an optical mouse.

SUMMARY OF THE INVENTION

1. Objects of the Invention

It is an object of the present invention to provide semiconductor laser device structure with improved mode control over transverse modes.

It is another object of the present invention to provide an improved vertical cavity surface-emitting laser (VCSEL) with narrow spectral width.

It is also another object of the present invention to provide an improved VCSEL with mode control and greater insensitivity to drive current and ambient temperature.

It is still another object of the present invention to provide a VCSEL structure having a mesa with portions of the upper mirror layer removed for mode control.

It is also another object of the present invention to provide an etching process to remove a portion of the emitting area of a VCSEL structure and thereby provide mode control and consistent fabrication, testing and reliability of VCSEL devices with narrow spectral width.

2. Features of the Invention

1. Briefly, and in general terms, the present invention provides a surface emitting laser having a substrate with top and bottom surfaces; a first stack of mirror layers of alternating indices of refraction located upon the top surface of the substrate; an active layer disposed over the first stack; a second stack of mirror layers of alternating indices of refraction disposed over the active layer; and a reduced-diameter mirror extension portion of the second stack that forms an optical aperture of the surface emitting laser extending outwards from a center portion of the second stack on a side of the second stack opposite the active layer.

In another aspect, the present invention also provides a method of manufacturing a vertical cavity surface emitting laser including providing a substrate; forming a first parallel stack of mirrors on the substrate; forming an active and spacer layer on the first parallel mirror stack; forming a second parallel mirror stack on the active and spacer layer; etching the second parallel mirror stack to define a mesa shaped structure; oxidizing the mesa shaped structure to form a current-confining central region in the mesa; and a portion of the central region of the mesa structure to remove a portion of the second parallel mirror stack.

One aspect of the present invention is to decouple the number of allowed transverse modes from the size of the oxide aperture, thereby avoiding problems associated with the resistance and reliability issues associated with smaller apertures.

Another aspect of the present invention is to dampen or reduce the AEMs to minimize or eliminate model competition arising from radial current injection

DESCRIPTION OF THE PREFERRED EMBODIMENT

Figure 1A:
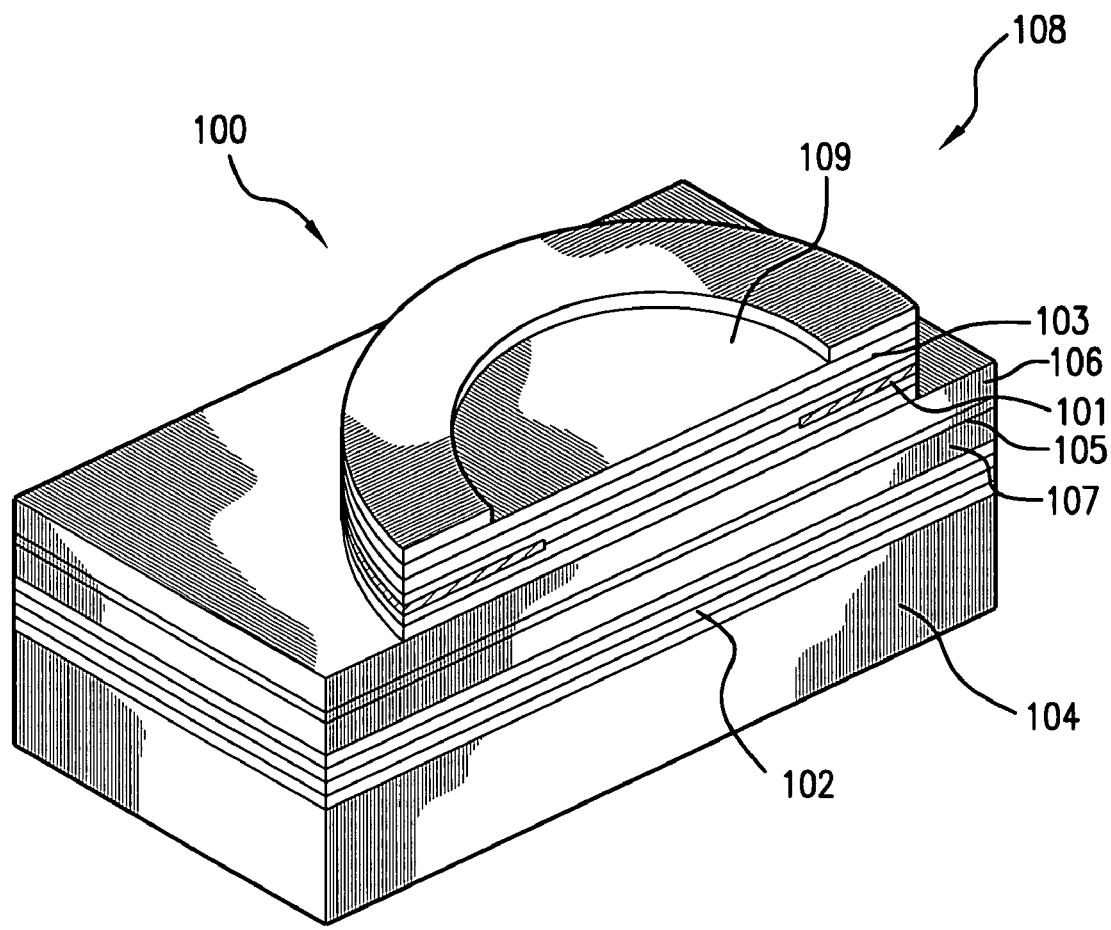
FIG. 1A is a fragmentary, cross-sectional view of an enlarged scale of a semiconductor structure for an oxide-confined VCSEL as is known in the prior art.

Details of the present invention will now be described, including exemplary aspects and embodiments thereof.

Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of actual embodiments nor the relative dimensions of the depicted elements, and are nor drawn to scale.

Referring to FIG. 1a there is shown a fragmentary, cross-sectional view of a semiconductor structure of an oxide confined VCSEL as is known in the prior art. In particular, the VCSEL 100 includes a laser cavity region 105 that is defined between a first semiconductor region 102 that forms a first mirror stack and a second semiconductor region 103 forms a second mirror stack. The semiconductor regions 102 and 103 are disposed on a substrate 104 which may be typically p-type gallium arsenide. The cavity region 105 includes one or more active layers (e.g., a quantum well or one or more quantum dots). The active layers may be formed from AlInGaAs (i.e. AlInGaAs, GaAs, AlGaAs and InGaAs), In GaAsP (i.e., InGaAsP, GaAs, InGaAs, GaAsP, and GaP), GaAsSb (i.e. GaAsSb, GaAs, and GaSb), InGaAsN (i.e. InGAAsN, GaAs, InGaAs, GaAsN, and GaN), or Aln GAAsP (i.e., AlInGaAsP, AlInGaAs, AlGaAs, InGaAs, InGaAsP, GaAs, InGaAs, GaAsP, and GaP). Other quantum well layer compositions also may be used. The active layers may be sandwiched between a pair of spacer layers 106, 107. First and second spacer layers 106, 107 may be composed of aluminum, gallium and arsenide and are chosen depending upon the material composition of the active layers. Electrical contacts are provided to the structure to enable a suitable driving circuit to be applied to the VCSEL 100.

The substrate 104 may be formed from GaAs, InP, sapphire ($Al_2O_3$), or InGaAs and may be undoped, doped n-type (e.g., with Si) or doped p-typed (e.g., with Zn). A buffer layer may be grown on substrate 104 before VCSEL 100 is formed. In the illustrative representation of FIG. 1, first and second mirror stacks 102, 103, are designed so that the laser light is emitted from the top surface of VCSEL 100, in other embodiments, the mirror stacks may be designed so that laser light is emitted from the bottom surface of substrate 104.

In operation, an operating voltage would be applied to the electrical contacts to produce a current flow in the semiconductor structure. The current will flow through a central region of the semiconductor structure resulting in lasing in a central portion of cavity region 105. A confinement region defined by a surrounding oxide region 101 or ion implanted region, or both, provides lateral confinement of carriers and photons. The relatively high electrical resistivity of the confinement region causes electrical current to be directed to and flow through a centrally located region of the semiconductor structure. In particular, in the oxide VCSEL, optical confinement of photons results from an index profile that guides photons that are generated in cavity region 105. The carrier and optical lateral confinement increases the density of carriers and photons within the active region and increases the efficiency with which light is generated within the active region.

In some embodiments, the confinement region 101 circumscribes a central region of the VCSEL 100, which defined an aperture through which VCSEL current preferably flows. In other embodiments, oxide layers may be used as part of the distributed Bragg reflectors in the VCSEL structure.

The first and second mirror stacks 102 and 103 respectively each includes a system of alternating layers of different refractive index materials that forms a distributed Bragg reflector (DBR). The materials are chosen depending upon the desired operating laser wavelength (e.g., a wavelength in the range of 650 nm to 1650 nm). For example, first and second mirror stacks 102, 103 may be formed of alternating layers of high aluminum content AlGaAs and low aluminum content AlGaAs. The layers of first and second mirror stacks 102, 103, preferably have an effective optical thickness (i.e., the layer thickness multiplied by the refractive index of the layer) that is about one-quarter of the operating laser wavelength.

The first mirror stack 102 may be formed by conventional epitaxial growth processes, such as metal-organic chemical vapor deposition (MOCVD) or molecular beam epitaxy (MBE), followed by etching.

Once first mirror stack 102, active layer 105 and second mirror stack 103 are completed, the structure is patterned to form one or more individual VCSELs. The upper surface of second mirror stack 103 is provided with a layer of photoresist material according to any of the well known method in the art. The photoresist layer is exposed and material is removed to define the position and size of either a mesa 108 or a trench (shown in FIG. 1b). The mesa 108 or trench is then formed by etching mirror stack 103 by any suitable means known in the art, such as dry or wet etch processes. Typical dry etch processes use chlorine, nitrogen, and helium ions, and wet etch processes use sulphuric or phosphide acid etches. In the mesa embodiment, the mesa may range from 25 to 50 microns, or preferably about 40 microns in diameter, and be about three to five microns in height above the surface of the substrate. In the trench embodiment to be shown in FIG. 1b, the trench would extend completely around and defined a generally mesa shaped are. In both embodiments, the mesa has a generally circular cross-section.

At the end of the processing sequence, a layer of dielectric material, such as silicon nitride ($SiN_x$), is deposited over the entire surface of VCSEL 100 and an opening is etched through on the upper surface of mesa shaped structure 108 to generally coincide with and define a light emitting area 109. A transparent metal contact layer is deposited in the emitting area and continued over mesa shaped structure 108 to define an electrical contact window and to provide sufficient surface for an external electrical contact. Generally, the transparent metal utilized is indium tin oxide (ITO), cadmium tin oxide, or the like. Additional conventional metal may be deposited on layer, if desired. It should be noted that electrical contact window basically controls the current distribution within upper parallel mirror stack.

Figure 1B:
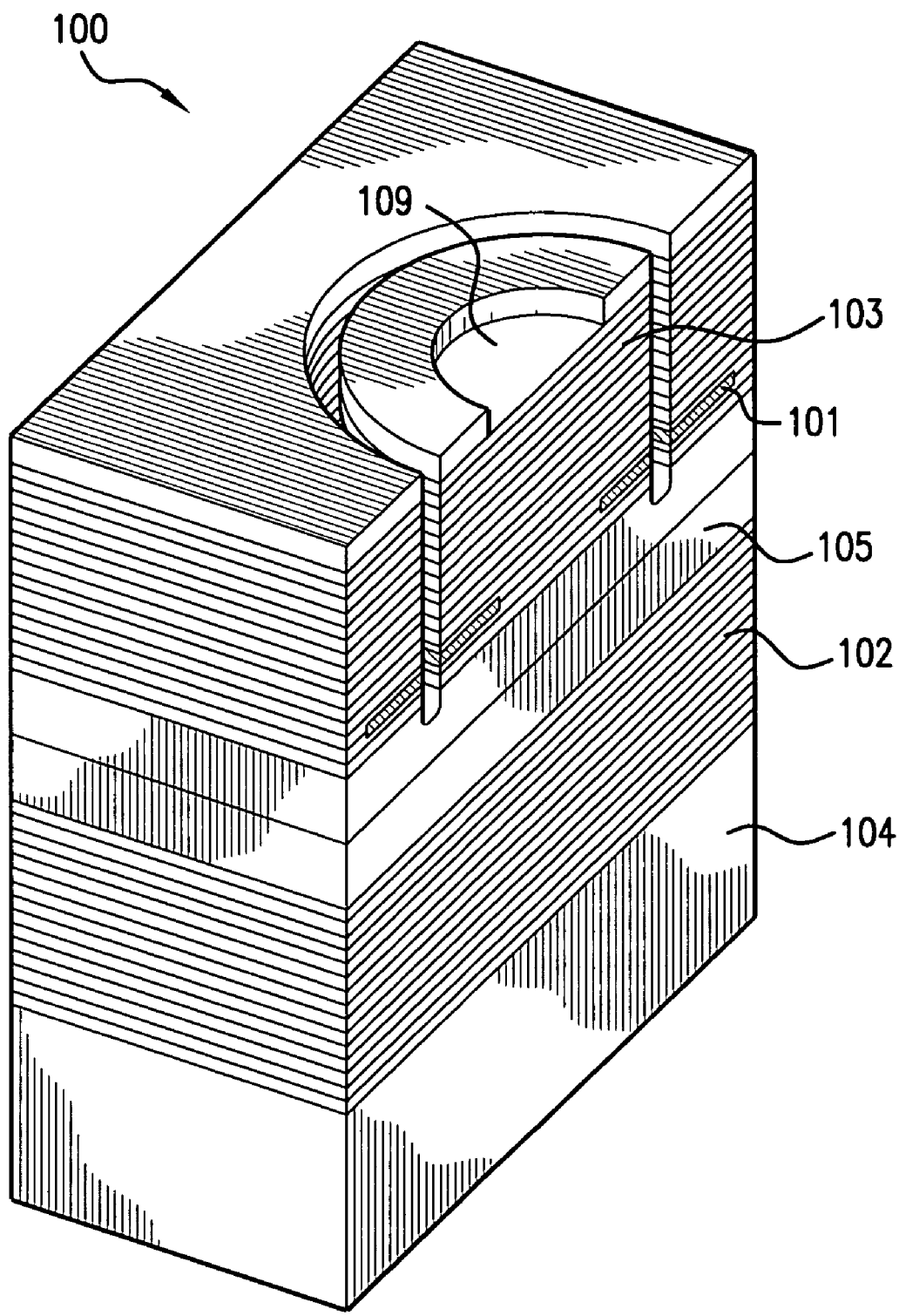
FIG. 1B is a fragmentary, cross-sectional view of an enlarged scale of a semiconductor structure for an ion trench type VCSEL as is known in the prior art.

FIG. 1b illustrates a perspective view of another VCSEL 100 as is known in the prior art, such as represented in published U.S. Patent Application 2003/0219921, or U.S. Pat. No. 6,628,694, which includes an insulating region that can be formed by partial oxidation of a thin, high aluminum-content layer within the structure of an associate VCSEL mirror. FIG. 1b represents a schematic cross-sectional view of an oxide-isolated VCSEL 100 surrounded by a trench 200, as opposed to the mesa type structure 108 shown in FIG. 1a. As indicated in FIG. 1b, VCSEL 100 generally includes an emission aperture 109, an oxide or ion implanted confinement region 101 forming an aperture, and an active region 105.

Figure 2:
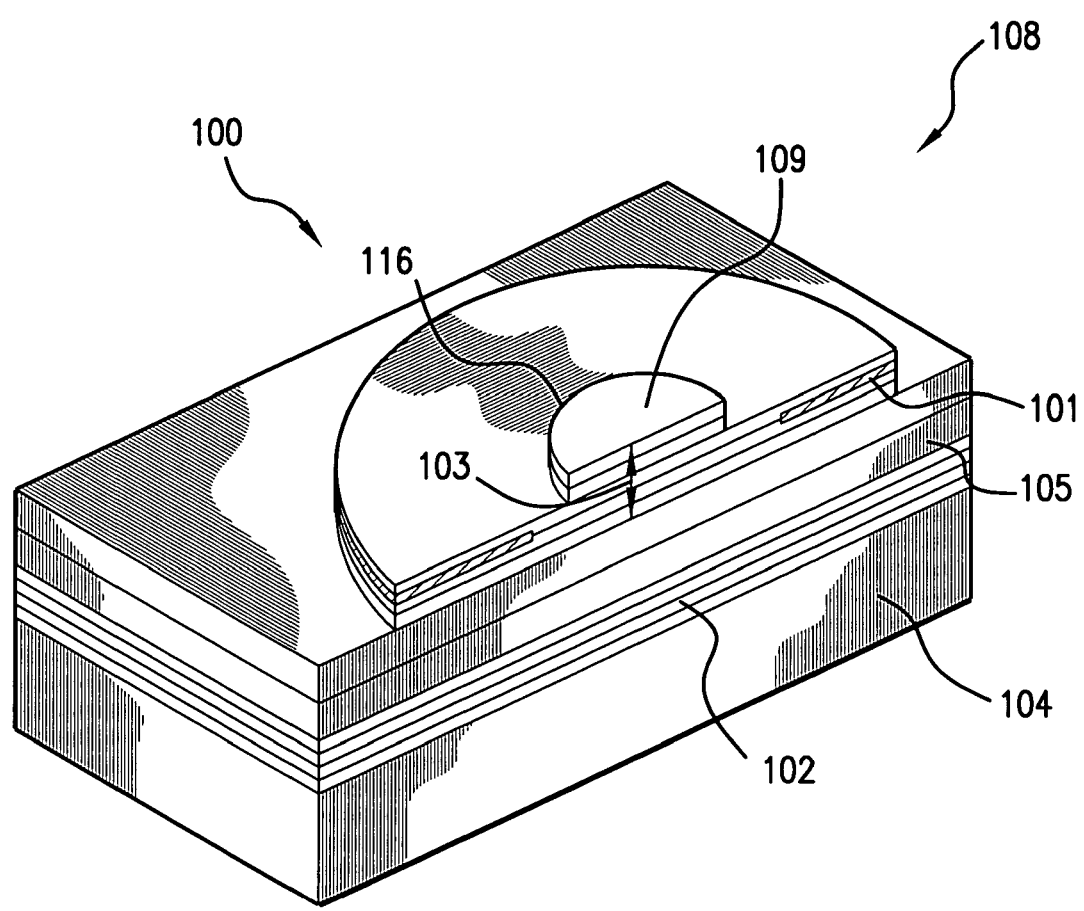
FIG. 2 is a fragmentary, cross-sectional detailed view of the semiconductor structure for a mesa type oxide-confined VCSEL according to the present invention.

FIG. 2 is a fragmentary, cross-sectional detailed view of the semiconductor structure for a mesa type oxide-confined VCSEL according to the present invention. A generally cylindrical, reduced diameter mirror extension portion 116 is provided in the top layers of the second mirror stack 103.

The intra-cavity approach using the mirror extension 116 reduces the series resistance of the VCSEL 100 thereby improving current injection. The mirror extension 116 provides an optical aperture that ensures single-mode operation over a desired operating temperature and current range.

The size of the optical aperture is designed to be smaller than that of the current aperture, therefore, higher order modes are spatially suppressed. By optimizing current injection, spatial hole burning effect can be minimized to sustain single-mode operation across wide operating current and temperature ranges. Because the lateral optical confinement is decoupled from the lateral current confinement, single mode operation can be achieved with larger oxide apertures. This gives a more reliable device and one with a higher electrostatic discharge (ESD)/electrical overstress (EOS) damage threshold.

The p-contact layer 111 (FIGS. 3C-F and 4) can be displaced at the anti-phase layer of mirror stack 103 to enhance discrimination of higher order transverse modes. The optical aperture 109 is a part of the top mirror 103 and is formed by ICP dry etching. To reduce free carrier absorption in the optical aperture an undoped DBR (or delectric DBR) may be used in the mirror extension 116. Alternatively, a lower contact layer doping and thinner contact layer may be used.

The diameter and height of the mirror extension 116 may be chosen to be in the order of 4 to 5 microns and 0.2 to 1.5 microns, respectively to ensure only coupling the fundamental mode of optical energy into the optical aperture 109. Higher order transverse modes are thus suppressed due to increasing loss and improved current injection.

The current aperture in the device 100 is confined by an oxidation layer and can also be compatible with an implant process if necessary. Since the optical aperture size is in the same scale as the fundamental mode spatial distribution, the current aperture can be increased up to 10 microns. Compared to the commonly used 4 microns or less oxide VCSELs, ESD voltage limits can also be significantly improved. The process of making the device 100 is also compatible with providing an ESD protection diode on the same chip, thereby relaxing the ESD control requirement for packaging and die handling.

Figure 3A:
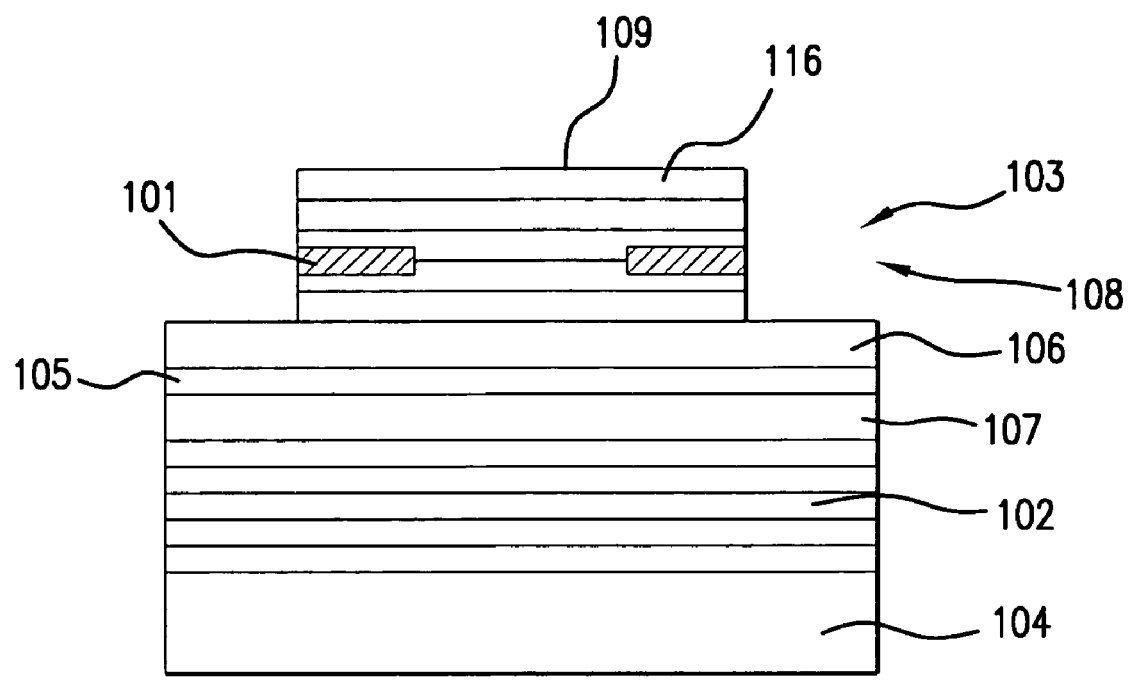
FIG. 3A is a fragmentary, cross-sectional detailed view of a semiconductor structure after etching the top peripheral sidewalls of the structure to form a mirror extension portion on a central region of the structure in a first process step according to the present invention.

Turning now to fabrication of the VCSEL device 100, FIG. 3A is a fragmentary, cross-sectional detailed view of a semiconductor structure after oxidizing the peripheral sidewalls of the mesa 108 to form a current-confining central region in the structure in a first process step according to the present invention. The mesa 108 has a generally planar top surface with a light emitting area 109.

Figure 3B:
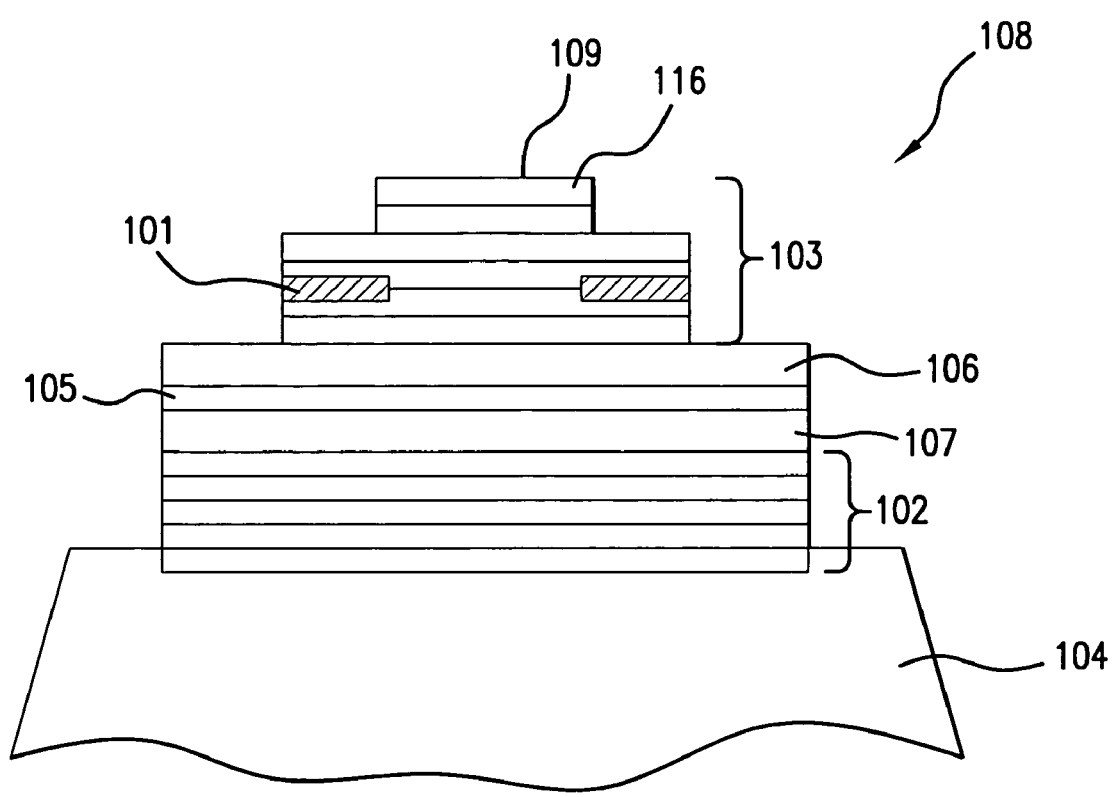
FIG. 3B is a fragmentary, cross-sectional detailed view of a semiconductor structure after etching the side walls to form the mesa structure and oxidizing the side walls to define a current aperture in subsequent process steps according to the present invention.

FIG. 3B is a fragmentary, cross-sectional detailed view of semiconductor structure after etching opposing sides of the device down to the substrate and also the upper outside edge of the mesa structure 108 to form the mirror extension 116 in the central region in the mesa structure 108 in a single second process step according to the present invention. The etching is preferably performed by a wet etching process such as etching with a dilute HF with DI water. Alternatively, dry etching processes, such as Cl/CH$_4$ reactive ion etching (RIE) or reactive ion beam etching (RIBE) may be used as well.

In the preferred embodiment, with the exception of the mirror extension 116, the etching of the opposing sides of the device extends through a portion of the first mirror stack 103, and a portion of the second mirror stack 102. The etch to the substrate on opposing sides of the device 100 is for the purpose of making an electrical contact to the substrate, as will be shown in subsequent steps.

In an even more preferred embodiment, the mirror extension 116 may first be defined in a first step by ICP etching. Following creation of the mirror extension 116, the sidewalls and top 109 of the mirror extension 116 may be coated with SiNx as a second process step.

As a third process step, the mesa 108 may be defined, again by using ICP dry etching. As a fourth process step, the current aperture may be defined by oxidation.

Figure 3C:
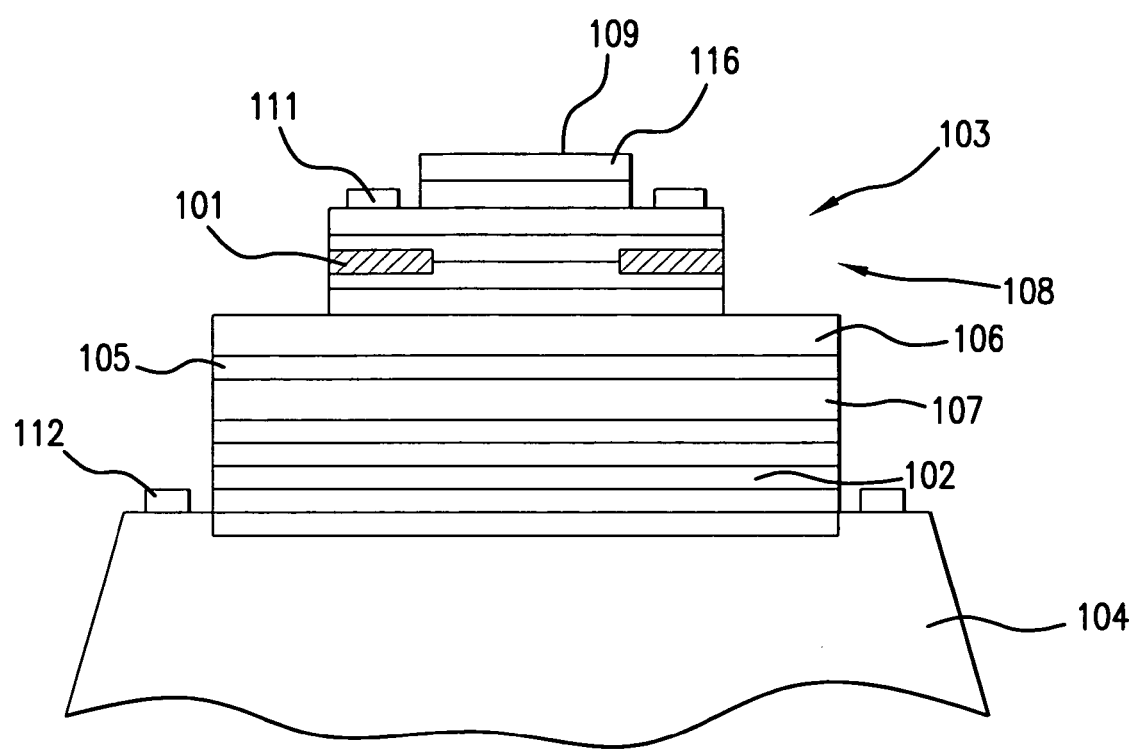
FIG. 3C is a fragmentary, cross-sectional detailed view of a semiconductor structure after deposition of the n and p ohmic contacts in the structure in a third process step according to the present invention.

FIG. 3C is a fragmentary, cross-sectional detailed view of a semiconductor structure after deposition of the n and p ohmic contacts in the structure in a third process step according to the present invention. The p contact 111 is a substantially annular ring (shown in FIG. 4) that makes ohmic electrical contact with the surface of the shoulder of the mesa 108. The n contact 112 is an annular segment (shown in FIG. 4) that makes ohmic electrical contact with the substrate 104.

Figure 3D:
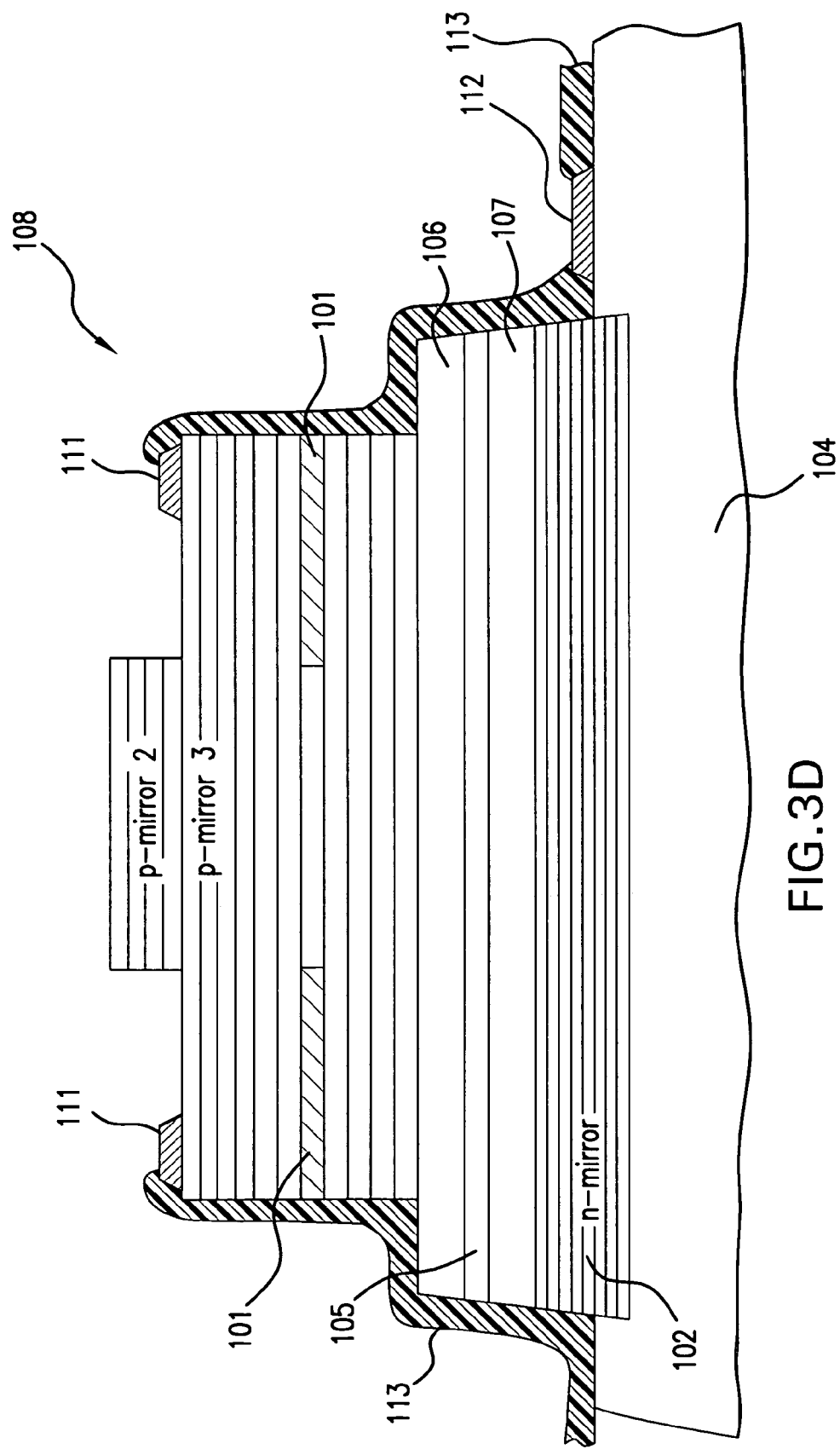
FIG. 3D is a fragmentary, cross-sectional detailed view of a semiconductor structure after deposition of a polyimide layer over portions of the structure in a fourth process step according to the present invention.

FIG. 3D is a fragmentary, cross-sectional detailed view of the semiconductor structure of FIG. 3C after deposition of a polyimide layer 113 over portions of the structure in a fourth process step according to the present invention. The polyimide layer 113 is typically spun on the wafer to a thickness from 4 to 6 microns, thermally cured, and patterned using a lithographic process known in the art to expose the n and p ohmic contacts 111 and 112, as well as the emission aperture 109.

Figure 3E:
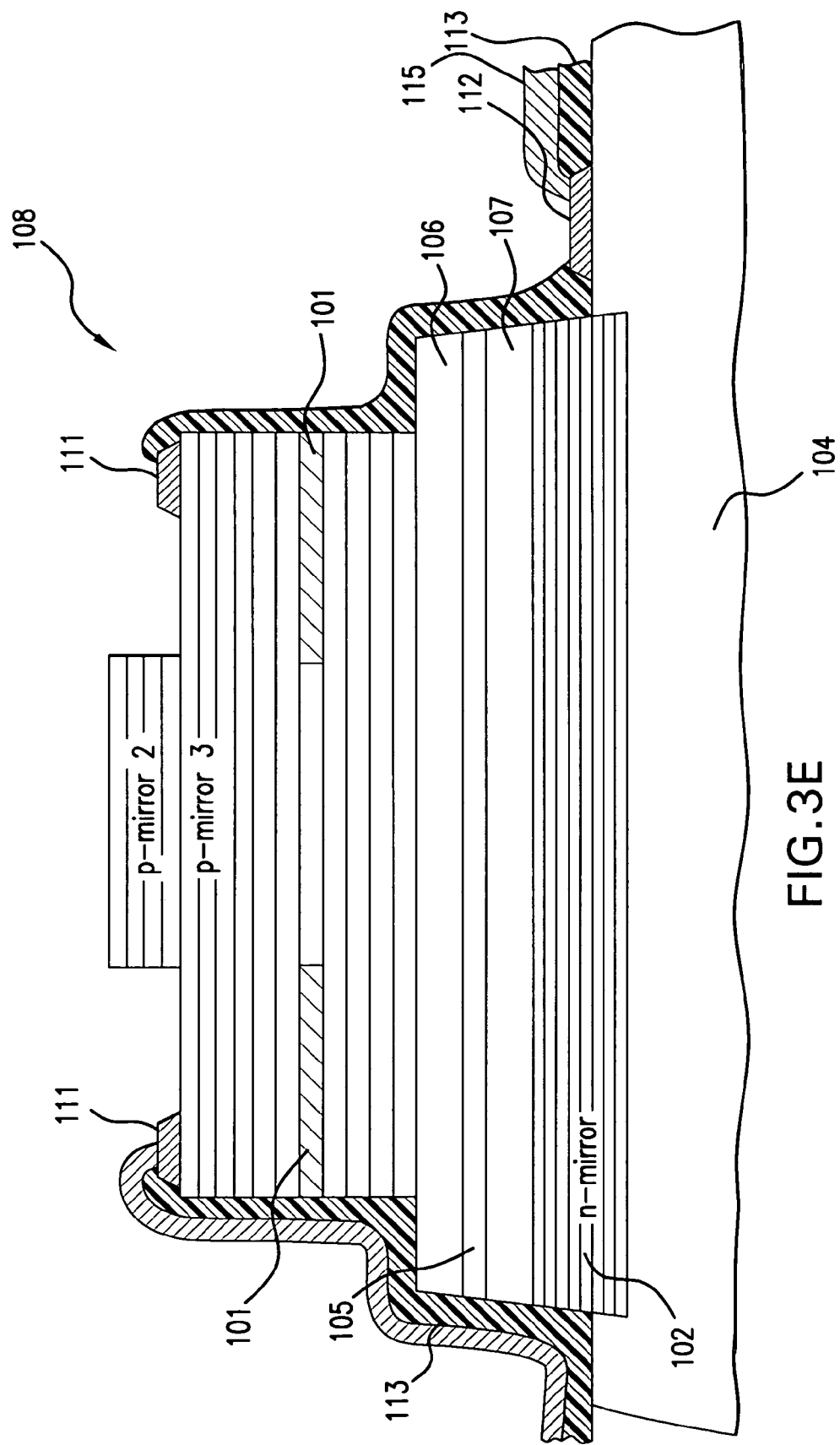
FIG. 3E is a fragmentary, cross-sectional detailed view of a semiconductor structure through the E—E plane shown in FIG. 6 after deposition of a metal bond pad layer on the structure in a fifth process step according to the present invention.
Figure 4:
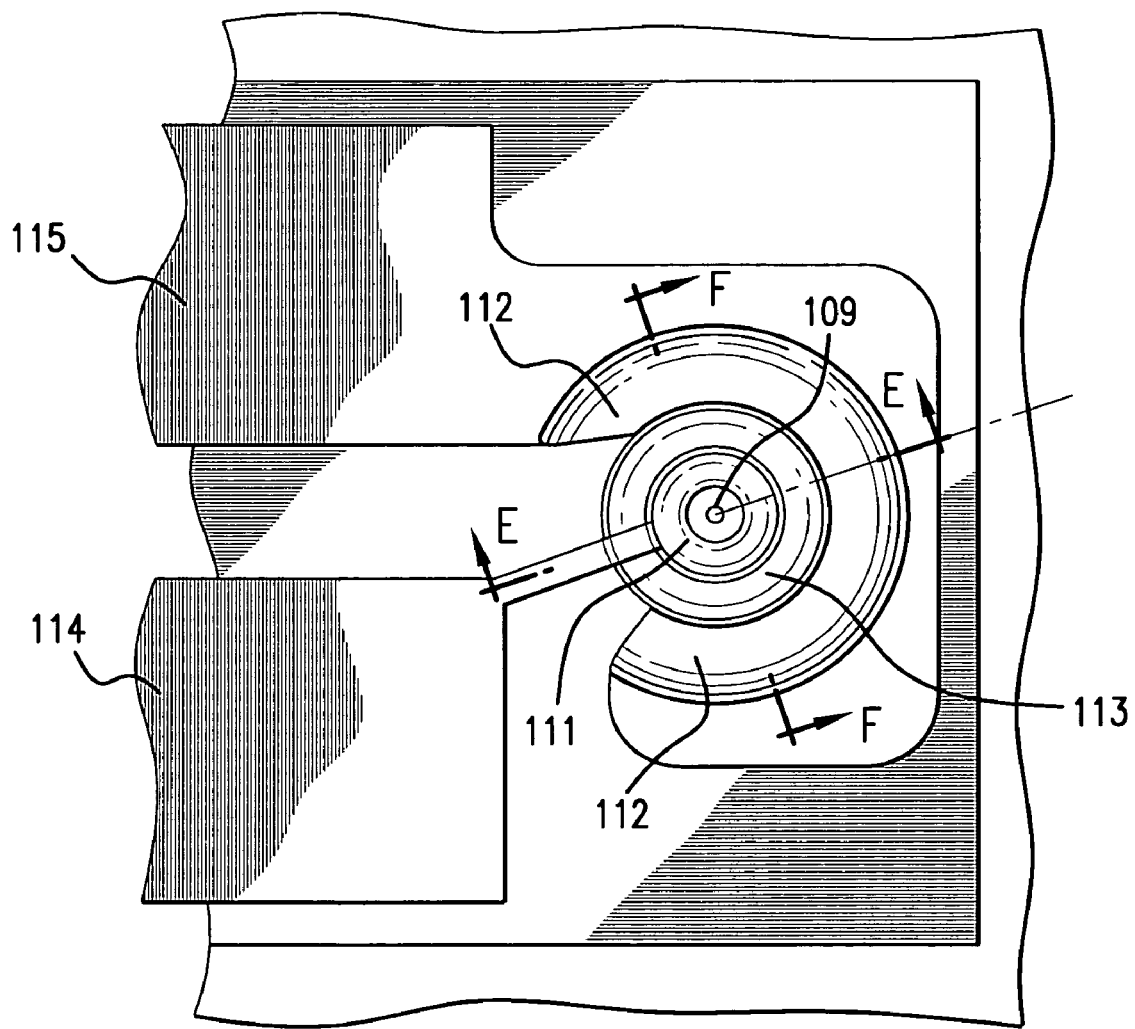
FIG. 4 is a top plan of the VCSEL semiconductor structure according to the present invention.

FIG. 3E is a fragmentary, cross-sectional detailed view of the semiconductor structure of FIG. 3D through the E-E plane shown in FIG. 4 after deposition of metal bond pad layers 114 and 115 on the structure in a fifth process step according to the present invention. The layer 114 makes electrical contact with the n-ohmic contact 111, and layer 115 makes electrical contact with the p-ohmic contact 112.

Figure 3F:
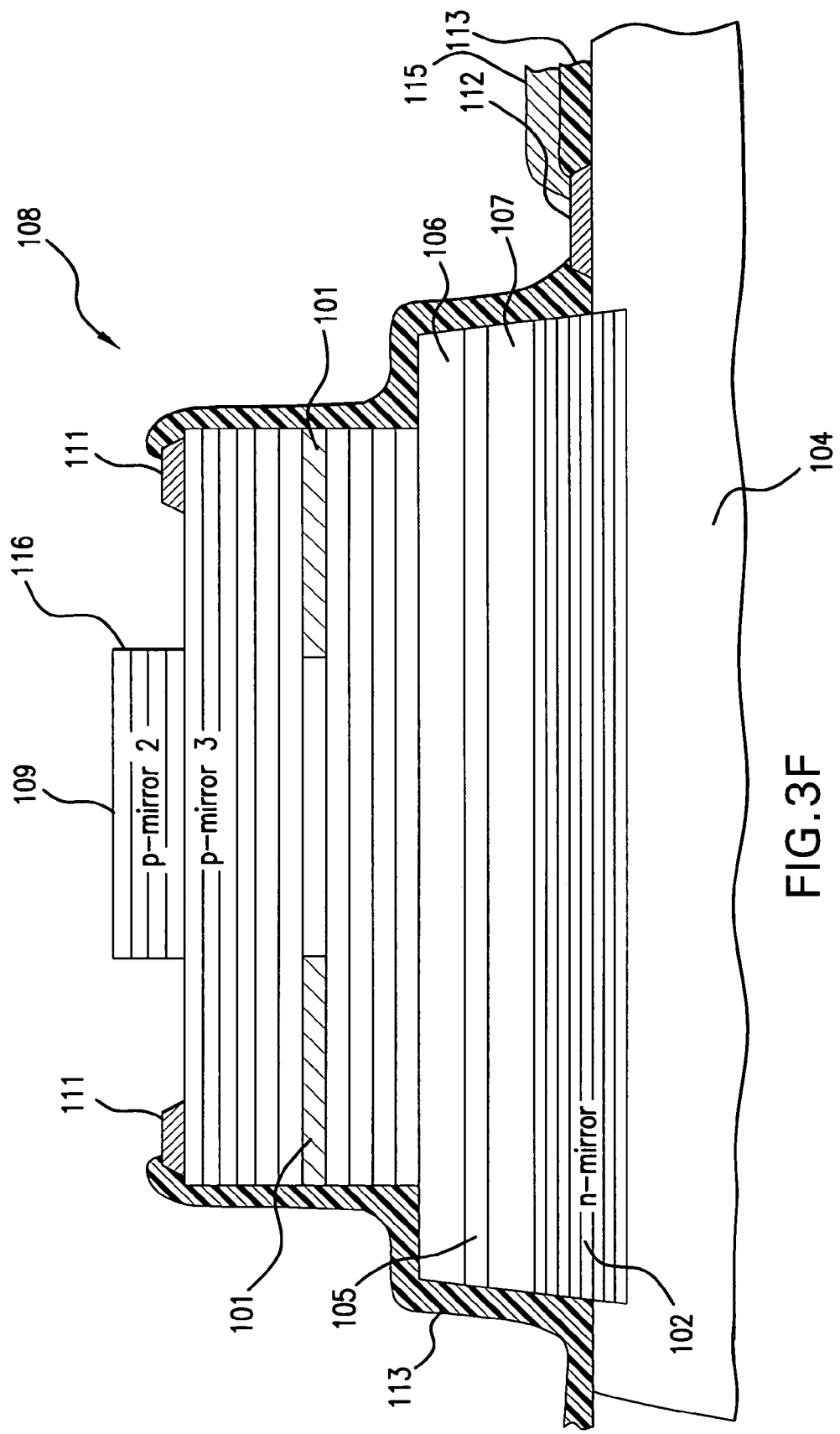
FIG. 3F is a fragmentary, cross-sectional detailed view of a semiconductor structure though the F—F plane shown in FIG. 6 after deposition of a metal bond pad layer on the structure in a fifth process step according to the present invention.

FIG. 3F is a fragmentary, cross-sectional detailed view of the semiconductor structure of FIG. 3D through the F-F plane shown in FIG. 4 after deposition of a metal bond pad layer on the structure in a fifth process step according to the present invention. The layer 115 is shown to make electrical contact with the p-ohmic contact 112 on the left hand side of the figure, and another portion of the layer 115 makes electrical contact with the p-ohmic contact 112 on the right side of the figure.

FIG. 4 is a top plan view of the semiconductor structure of FIG. 3E and FIG. 3F after deposition of metal bond pad layers 114 and 115 on the structure in a fifth process step according to the present invention.

It will be understood that each of the elements and process steps described above, or two or more together, also may find a useful application in other types of constructions differing from the types described above.

While the invention has been illustrated and described as embodied in a semiconductor structure for VCSEL devices, and the process for making such structure, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

We claim:

1. A surface emitting laser comprising:
   a substrate with top and bottom surfaces;
   a first stack of mirror layers of alternating indices of refraction located upon the top surface of the substrate;
   an active layer disposed over the first stack;
   a second stack of mirror layers of alternating indices of refraction disposed over the active layer;
   a current confinement region disposed within the second stack of mirrors; and a reduced-diameter mirror extension portion of the second stack that forms an optical aperture of the surface emitting laser extending outwards from a center portion of the second stack on a side of the second stack opposite the active layer said reduced-diameter mirror extension portion having a relative diameter smaller than the current confining region and wherein the relative diameter and height of the reduced-diameter mirror extension portion results in emission coupling only a fundamental mode of optical energy through the mirror extension portion and suppresses higher order transverse modes.

2. The surface emitting laser as in claim 1 further comprising an annular contact disposed around a base of the mirror extension.

3. The surface emitting laser as in claim 1 wherein the mirror extension further comprises an undoped distributed Bragg reflector.

4. The surface emitting laser as in claim 1 wherein the mirror extension further comprises a dielectric distributed Bragg reflector.

5. The surface emitting laser as in claim 1 wherein the mirror extension further comprises a diameter of from 4 to 5 micrometer.

6. The surface emitting laser as in claim 1 wherein the mirror extension further comprises a height of approximately 0.2 to 1.5 micrometers.

7. The surface emitting laser as in claim 1 wherein the mirror extension further comprises a cylindrical shaped region.

8. The surface emitting laser as in claim 1 wherein said laser is a gain guided implant VCSEL including an implant region for current confinement.

9. The surface emitting laser as in claim 1 further comprising disposing a p-contact layer on an antiphase layer of the second stack of mirror layers.

10. A surface emitting laser comprising:
a substrate with top and bottom surfaces;
a first stack of mirror layers of alternating indices of refraction located upon the top surface of the substrate;
an active layer disposed over the first stack; and
a second stack of mirror layers of alternating indices of refraction disposed over the active layer, said second stack of mirror layers having a current confinement region, a first diameter adjacent the active layer and a step change to a second reduced diameter on a distal end of a relative size smaller than the current confining region and wherein the relative diameter and height of the second reduced diameter portion of second stack of mirror layers results in emission coupling only a fundamental mode of optical energy through the distal end and suppresses higher order transverse modes.

11. The surface emitting laser as in claim 10 further comprising an annular contact disposed around the second stack of mirror layers on a surface of the step change from the first diameter to the second diameter.

12. The surface emitting laser as in claim 10 wherein mirror layers within the second reduced diameter further comprises an undoped distributed Bragg reflector.

13. The surface emitting laser as in claim 10 wherein mirror layers within the second reduced diameter further comprises a dielectric distributed Bragg reflector.

14. The surface emitting laser as in claim 10 wherein the second reduced diameter further comprises 4 to 5 micrometer.

15. The surface emitting laser as in claim 10 wherein the mirror layers within the second reduced diameter further comprises a height of approximately 0.2 to 1.5 micrometers.

16. The surface emitting laser as in claim 10 wherein the mirror layers within the second reduced diameter further comprises a cylindrical shaped region.

17. The surface emitting laser as in claim 10 wherein said laser is a gain guided implant VCSEL including an implant region for current confinement.

18. The surface emitting laser as in claim 10 further comprising disposing a p-contact layer on an antiphase layer of the second stack of mirror layers.

19. A surface emitting laser comprising:
a substrate with top and bottom surfaces;
a first stack of mirror layers of alternating indices of refraction located upon the top surface of the substrate;
an active layer disposed over the first stack; and
a second stack of mirror layers of alternating indices of refraction disposed over the active layer, said second stack of mirror layers having a current confinement region, a first portion of mirror layers having a first diameter adjacent the active layer and a second portion of mirror layers having a second reduced diameter on a distal end, wherein a relative height and diameter of the second reduced diameter portion of the second stack of mirrors results in emission coupling only a fundamental mode of optical energy through the distal end and suppresses higher order transverse modes.

20. The surface emitting laser as in claim 19 further comprising disposing a p-contact on an outside surface of a periphery of a mirror layer of the first portion lying adjacent the second portion.

* * * * *